United States Patent [19]
Curtice

[11] 4,158,784
[45] Jun. 19, 1979

[54] PULSE TRAIN GENERATOR

[75] Inventor: Walter R. Curtice, West Windsor Township, Mercer County, N.J.

[73] Assignee: RCA Corporation, New York, N.Y.

[21] Appl. No.: 862,191

[22] Filed: Dec. 19, 1977

[51] Int. Cl.² .......... H03K 3/357; H03K 3/64
[52] U.S. Cl. .............. 307/260; 307/299 R; 307/317 A; 328/16; 331/107 G
[58] Field of Search ........... 307/260, 299 R, 317 A; 328/16, 19, 59; 331/107 G

[56] References Cited

U.S. PATENT DOCUMENTS

| | | |
|---|---|---|
| 3,515,995 | 6/1970 | Belcourt et al. ............ 307/260 X |
| 3,764,830 | 10/1973 | Blore et al. ............ 307/260 |
| 3,983,416 | 9/1976 | Gronson ............ 307/260 |
| 4,000,415 | 12/1976 | Curtice ............ 307/260 |

OTHER PUBLICATIONS

IEEE Transactions on Electron Devices, pp. 504–515, vol. Ed 21, No. 8, Aug. 1974, "Characteristics and Applications of a Schottky–Barrier–Gate Gunn Effect Digital–Device", by Sugeta et al.

Primary Examiner—John S. Heyman
Attorney, Agent, or Firm—H. Christoffersen; Joseph D. Lazar; Raymond E. Smiley

[57] ABSTRACT

A pulse train generator operating at subnanosecond periods includes a transferred-electron device (TED) in series with an open circuited resonant transmission line. The transmission line sustains domain formation in the TED. A filter coupled to the TED may be utilized to produce pulses at a subharmonic of the TED transit time frequency, determined by the length of the transmission line.

11 Claims, 1 Drawing Figure

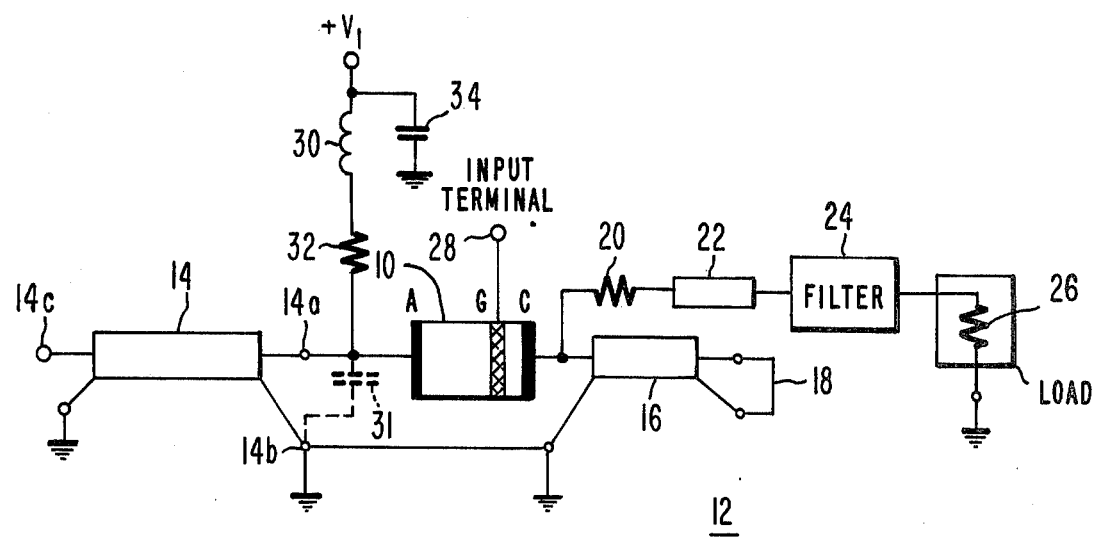

PULSE TRAIN GENERATOR

The Government has rights in this invention pursuant to Contract No. N00039-75-C-0225 awarded by the Department of the Navy.

BACKGROUND OF THE INVENTION

1. Field of the Invention

The present invention relates to clock pulse generators operating in a subnanosecond period range.

2. Description of the Prior Art

Precise interval measurements are essential in nuclear and ballistic time-of-flight tests, radar ranging and in the characterization of active components, such as integrated circuits. For a detailed discussion of time interval measurements, reference is made to "Measure Time Interval Precisely," by David Martin, Electronic Design, vol. 24, Nov. 22, 1974, pp. 162, et seq. Digital signal processing equipment for making such interval measurements desirably utilizes a pulse train circuit, startable on command, producing short duration pulses with accurately controlled interpulse spacing. One such pulse train circuit utilizing transferred electron logic devices (TELD) is described in U.S. Pat. No. 4,000,415 issued Dec. 28, 1976, to the instant inventor and assigned to the common assignee.

The two terminal transferred electron device (TED), known as a Gunn-Effect Device, and the three-terminal transferred-electron logic device (TELD), known as a Schottky-Barrier Gate Gunn-Effect Digital Device are well known.

TED's and TELD's have a negative resistance over a frequency range which is essential to the present invention as described in detail below. For further details on the negative conductance properties of TELD's reference is made to "Multifrequency Operation of a Quenched-Domain Mode Gunn-Effect Device," by W. R. Curtice and D. D. Khandelwal, Proceedings of the IEEE, vol. 59, No. 3, March 1971, pp. 416–417.

A gate terminal, an anode terminal, and a cathode terminal comprise the three terminals of a TELD. Typically, current is conducted from the anode to the cathode. When a voltage between the anode and the gate exceeds a threshold voltage, an electron charge depletion region followed by an electron charge accumulation region forms and migrates from the gate to the anode in a period of time known in the art as a transit time period. The reciprocal of the transit time period of a TELD in a resistive circuit is the device's natural transit-time frequency. The depletion region and the accumulation region are collectively referred to as a dipole domain. The formation of the dipole doamin causes the current to decrease.

When the domain has migrated to the anode, the current increases. When the threshold voltage is maintained to sustain the formation of mobile domains, the TELD oscillates.

The anode-gate threshold voltage is determined by voltages applied to the anode and the gate with respect to the cathode, the geometry of the TELD, and the material constants. For a more detailed description of TELD's reference is made to "Threshold Condition of Schottky-Gate-Gunn Pulse Device," Y. Utsugi, et al., Review of the Electrical Communication Laboratories, volume 23, Nos. 3–4, March–April, 1975, pages 279, et seq.

TELD's have been utilized in the construction of high speed pulse train generators. For a discussion of prior art pulse train generators, reference is made to "Characteristics and Applications of a Schottky-Barrier-Gate Gunn-Effect-Digital Device," by Sugeta, et al., IEEE Transactions on Electron Devices, volume ED-21, No. 8, Aug. 19, 1974, pp. 504, et seq.

Such prior art pulse train generators do not utilize the same circuit as in the preferred embodiment of the instant invention.

Further, typical TELD devices presently available have transit times ranging from 0.5 nanoseconds to 0.1 nanoseconds which are shorter than desired for clock pulses in some applications. Additionally, TELD's do not provide much power output in resistive circuits. If the TELD is incorporated into a tuned circuit, the power output is considerably improved. However, tuned circuits typically produce an output signal which is sinusoidal in nature, while in typical utilization devices for interval timing applications, a series of pulses of short duration compared to their period is desirable.

SUMMARY OF THE INVENTION

In accordance with the invention, a circuit for producing a pulse train at a fundamental frequency and at least one harmonic frequency thereof includes a transmission line and an active device.

The transmission line is substantially non-dispersive at the fundamental and harmonic frequencies and has a length substantially equal to one half the wavelength in the line associated with the fundamental frequency. The transmission line is open-circuited at one end and short-circuited at the other end.

The active device is coupled in series in the transmission line at a point removed from the ends and is operable to exhibit negative resistance at the fundamental and harmonic frequencies. An output terminal is coupled to the transmission line at a point between the short circuit end thereof and the active device.

BRIEF DESCRIPTION OF THE DRAWING

The sole FIGURE is a startable pulse train generator circuit embodying the present invention.

DETAILED DESCRIPTION OF THE PREFERRED EMBODIMENT

In the FIGURE a pulse train generator circuit 12 includes an active device, such as a TELD 10, which is operable to exhibit a negative resistance at a fundamental frequency and at least one harmonic frequency. TELD 10 is connected in series with a two conductor transmission line comprising an open-circuited portion 14 and a short-circuited portion 16. In particular, TELD 10 is connected at its anode to one terminal 14a of transmission line portion 14. The remaining terminal 14b is grounded. Terminal 14c at the end of transmission line portion 14 is open circuited.

TELD 10 is series coupled at its cathode (C) terminal to the proximal end of transmission line portion 16. Transmission line portion 16 has a length less than 0.1 wavelength of the output pulse period of circuit 12. Moreover, transmission line portion 16 is short-circuited at its distal end by a wire 18. The remaining terminal at the proximal end of transmission line portion 16 is grounded. The total length of the transmission line (portions 14 and 16) is substantially equal to one half the wavelength in the transmission line associated with the fundamental frequency desired to be produced by the circuit. Although shorted transmission line portion 16 is preferable as a means permitting an output signal from TELD 10, an inductor is satisfactory in some applications. If an inductor is used, it must be of small value and approximate the impedance charactertistics of a short length, l, of shorted transmission line 16 of characteristic impedance $Z_o$. The value of inductance can be calculated, as is well known in the art, as substantially equal to $l \cdot Z_o \div c$, where c is the velocity of electromagnetic waves in the transmission line. In the claims appended to this application, the words "transmission line" are intended to encompass other elements, such an an inductor, which exhibit impedance characteristics of a transmission line at frequencies of interest.

Transmission line portions 14 and 16 must be of the type in which the group velocity of signals at all frequencies of interest are substantially the same. Any non-dispersive transmission line meets this criteria. Examples of types of suitable transmission line are coaxial lines and microstrip transmission lines.

The transit time of a domain of TELD 10 is on the order of $t_o \div 3$, where $t_o$ is equal to the desired period of the pulse train generator circuit 12. The cathode of TELD 10 is connected in series with a decoupling resistor 20, a suitable length of transmission line 22, a low pass filter 24, and a load 26. Filter 24 is arranged to pass only signals at frequencies associated with the periods, $t_o$ and $t_o \div 2$, and reject higher frequencies, such as produced by TELD 10 while in its domain forming mode.

The gate (G) of TELD 10 is coupled to an input terminal 28. Although not shown, an input capacitor may be provided between terminal 28 and gate (G). Further, if desired, gate bias may be provided in the form of a suitable source of D.C. bias potential (not shown) inductively coupled to gate (G). TELD 10 anode bias is provided by the positive output of a D.C. source $V_1$, series coupled through an inductor 30 and a resistor 32 such that TELD 10 is biased below its threshold voltage. A noise filter capacitor 34 is connected from source $V_1$ to ground. Inductor 30 is of value such that it is effectively an open circuit at signal frequencies of interest. Inductor 30 and circuit resistance inherent in circuit 12 also determine a time constant which is long in comparison to the transit-time period and result in a change in operating point of TELD 10 many transit-time periods after initial domain formation.

In one exemplary embodiment, resistor 32 is a short circuit. However, when resistor 32 has an non-zero resistance, it provides a load that causes the anode-cathode biasing of TELD 10 to be further removed from the threshold voltage for improved quiescent stability.

Operation of the circuit of the FIGURE is as follows. In the absence of a signal pulse at terminal 28, TELD 10 is in aquiescent state, such that a relatively high anode to cathode current (from source $V_1$) passes through TELD 10, and through transmission line portion 16, to ground. When a negative going input pulse of sufficient value is applied to terminal 28, an increased voltage between the anode and the gate causes TELD 10 to switch to a domain forming mode. In the description that follows it is assumed that transmission line portion 16 is of negligible length so that transmission line portion 14 constitutes the entire transmission line. It is further assumed that resistor 32 is zero ohms. Therefore, when a domain is formed in TELD 10 with a consequent reduction in anode to cathode current (referred to as TELD current hereinafter), the current in inductor 30 cannot instantaneously be reduced.

When an exemplary domain is formed in TELD 10 there is a sudden decrease, $\Delta I$, in TELD current as described above. This decrease in TELD current continues for a time, $t_o \div 3$, while the exemplary domain travels to the anode at which time the TELD current returns to its former higher value until a new domain is formed. As there can be no instantaneous change in current through inductor 30, there is a sudden increase of current, equal to $\Delta I$, at transmission line terminal 14a. Further, given a characteristic impedance, $Z_o$, in transmission line portion 14, a positive voltage pulse of value $\Delta I \cdot Z_o$ is produced at terminal 14a. The voltage pulse travels along transmission line 14 in time $t_o \div 2$ and is reflected as a positive voltage pulse from terminal 14c. The voltage pulse returns to terminal 14a at a time, $t_o$, after being produced at terminal 14a.

The returned positive voltage pulse is applied to TELD 10 anode (A) to cause the anode-to-cathode voltage to rise above the threshold voltage, thereby causing TELD 10 to sequentially produce at least several domains. The returned positive voltage pulse arrives at a time ($t_o$), after the exemplary domain is formed. The returned positive pulse reinforces the formation of the third domain formed after the exemplary domain is formed. Transmission line 14 thus supports the third subharmonic signal of TELD 10 and provides the resonant circuit which is excited by TELD 10. Additionally, any power loss in transmission line portion 14 is supplied by TELD 10.

In the same manner, transmission line portion 14 provides returned voltage pulses to TELD 10 anode at the same time another domain is being formed at the fundamental transit-time period, $t_o \div 3$, and also the second subharmonic period, $t_o \div 2$. Thus transmission line portion 14 satisfies oscillation conditions for three frequencies simultaneously. Strong oscillation at the transit-time period, $t_o \div 3$, and the output period, $t_o$, are required for proper operation. Strong oscillation at the second subharmonic period, $t_o \div 2$, is useful for providing narrower output pulses as described in greater detail below.

TELD 10 produces a domain in a time of 100 ps or less. However, because of stray capacitance 31, illustrated in phantom in FIG. 1, at TELD 10 anode, the voltage pulse at terminal 14a has a rise time longer than the domain forming time. Thus, the voltage signal returning from transmission line 14 has a rise time longer than 100 ps. Further, as capacitance 31 exhibits lowest impedance at high frequencies, such as the signal of period $t_o \div 3$, pulses of this period have a reduced amplitude at terminal 14a. A smaller voltage reduction occurs for a voltage of period $t_o \div 2$ and even less reduction of voltage occurs for signals of period $t_o$. Therefore, the signal on transmission line portion 14 has strong third subharmonic signals (for period $t_o$).

In practice, the output signal manifested at TELD 10 cathode is small unless transmission line portion 16 is of non-negligible length, in which case the time, $t_o$, must equal the sum of the round trip time delays of transmission line portion 14 and transmission line portion 16.

When the TELD 10 current changes due to domain formation, the voltage across transmission line portion 16 at the cathode terminal of TELD 10 also changes because of the impedance of the transmission line portion 16. Thus, as described above, circuit 12 upon being triggered by an input signal produces a series of pulses of fundamental period $t_o$ at the cathode of TELD 10 which has a domain transit time of $t_o \div 3$. The process described above repeats until the anode voltage of TELD 10 changes due to the time constant associated with inductor 30 as described previously in the absence of an input signal at terminal 28. This time constant is chosen to be very large in comparison to $t_o$.

The changes in TELD current as domains are serially formed are manifested as an alternating signal at filter 24 at the transit time frequency of TELD 10 and including a third subharmonic frequency corresponding to the travel time of pulses in transmission line 14. Filter 24 produces a signal at its output terminal 26 which is at the third subharmonic (period $t_o$) and may contain a second subharmonic signal (period $t_o \div 2$). The signal produced can consist of pulses with sharp rise and fall times if second subharmonic signals are present. Such pulses are desired by digital circuits to which terminal 26 may be connected.

The transit time in transmission line 14 need not be exactly three times the domain transit time in TELD 10. If transmission line 14 is made shorter, the travel time of a voltage pulse signal through the transmission line portion 14 is decreased and the frequency of the output signal at terminal 16 is increased. Conversely, if transmission line portion 14 is increased, the travel time of a voltage pulse (from and to terminal 14a) through the transmission line is increased and the frequency of the output signal at terminal 26 is decreased. A TELD 10, having a domain transit time of $t_{TT}$, and producing low power output in a resistive circuit operates satisfactorily when transmission line portion 14 has a travel time of $t_o$, where $t_o = 3 t_{TT} \pm 30\%$. The operation is satisfactory because transmission line portion 14 is a resonant circuit that acts to either extend or quench domain formation in TELD 10. In addition, transmission line portion 14 causes TELD 10 to produce a larger power output than a simple resistive circuit.

Circuit 12, thus far described, produces uniformly spaced output pulses once triggered by a pulse at terminal 28. In some applications, it may be desirable to have a free running oscillator circuit, thereby producing uniformly spaced output pulses continuously without triggering. When the free running circuit is desired, a simple transferred electron device (TED), other wise known as Gunn diode having no Schottky barrier gate, may be substituted for TELD 10. $V_1$ is increased to cause the anode-to-cathode voltage of the TED to be above its threshold voltage. When the anode to cathode voltage of the TED is above its threshold voltage, mobile domains are formed in sequence. The transit time period in a TED is the time required for domain formation at the cathode, travel to and collection at the anode. The reciprical of the transit time period of a TED in a resistive circuit is called the natural transit-time frequency. Further if it is desired to utilize the TED rather than TELD 10, but with the input triggering or synchronization features of TELD 10, input terminal 28 is capacitively coupled to the anode of the TED. Although the TED is more difficult to trigger than TELD 10, more TED's than TELD's are presently available from suppliers.

In one working embodiment, circuit elements having parameters described below are utilized. In particular, a TELD 10 having a natural transit time of approximately 300 picoseconds, is utilized to produce an output signal at terminal 26 having a period of 1.25 nanoseconds with 0.1V amplitude at a load of 50 ohms. TELD 10 is a planar device constructed with an n-type gallium arsenide (GaAs) layer grown on a semi-insulating substrate of gallium arsenide material. It has:

$n \cdot 1 \geq 10^{13}/cm^2$ and $n \cdot d \geq 10^{12}/cm^2$ where n is the donor density in the epitaxial layer, l is the cathode-anode separation and d is the epitaxial layer thickness. A choice of $n = 1 \cdot 10^{16}/cm^3$, $l = 35 \mu m$, $d = 2 \mu m$ and anode-to-gate spacing of 28 $\mu m$ should produce 25 to 40 percent of current drop in GaAs devices with low defect density, low trapping center density and a large low-field mobility.

The circuit elements in the working embodiment have the following values:

$V_1 = 12.0$ volts
Inductor 30 = 40 nH
Resistor 32 = 0.0 ohms
Transmission line 14 = coaxial line section with one way time delay of 0.55 ns
Transmission line 16 = coaxial line section with one way time delay of 0.08 ns
$Z_o = 50$ ohms
Filter 24 = 1.5 GHz, low pass
Load 26 = 50 ohms
Capacitor 34 = 100 pF
Resistor 20 = 300 ohms The circuit just described should not be confused with a multiresonant circuit with subharmonic power extention employing avalanche diodes to produce a high efficiency oscillation mode called TRAPATT mode which, in schematic form, appears similar in appearance. TRAPATT mode exists only in avalanche diodes of restrictive parameters and operated in a circuit of specialized design. When established, this mode causes the diode to have a trapped plasma (during part of the RF cycle) which is not present in the case of a single avalanche diode oscillator. A discussion of the circuit and diode design is given by W. J. Evans, "Circuits for High-Efficiency Avalanche-Diode Oscillators," IEEE Trans. a Microwave Theory and Tech., vol. MTT-17, No. 12, December 1969, pp. 1060-1067.

The TRAPATT circuit is quite different from the circuit of the figure. A TELD would not operate in the TRAPATT circuit because the condition for oscillations are quite different. For example, both circuits require about one half wavelength lengths at lowest frequency, but TRAPATT requires a short circuited or low impedance termination whereas the TELD requires an open circuited or high impedance termination. Thus, the voltage reflected from terminal 14c is the same polarity as the incident signal in the TELD case but of opposite polarity in the TRAPATT case. Conversely, a TRAPATT diode would not operate in the TELD circuit of the figure.

It will be appreciated by those skilled in the art that transferred electron devices exhibit negative conductance properties due to space charge modes other than the high-field domain mode. An example is the accumulation layer mode. The claim language is intended to encompass TEDs and TELDs operated in such modes.

What is claimed is:

1. A circuit for producing a pulse train at a fundamental frequency and at least one harmonic frequency, comprising:

a two conductor transmission line substantially non-dispersive at said fundamental and harmonic frequencies, said line having a length substantially equal to one half of the wavelength therein associated with said fundamental frequency, said line being open circuited at one end and short circuited at the other end;

an active device coupled in series in said line at a point removed from said ends and being operable to exhibit negative resistance at said fundamental and harmonic frequencies; and an output terminal coupled to said transmission line at a point between said active device and said short circuited end for providing a signal at said fundamental and harmonic frequencies.

2. The combination as set forth in claim 1 wherein said active device is a transferred electron device having anode and cathode terminals and having a transit time period substantially equal to the third harmonic frequency of said fundamental frequency.

3. The combination as set forth in claim 2 wherein said output terminal is coupled to said cathode terminal.

4. The combination as set forth in claim 1 further including a filter coupled to said output terminal, to pass signals at said fundamental frequency and the second harmonic frequency thereof and to reject signals at other harmonic frequencies thereof.

5. The combination as set forth in claim 2 wherein said cathode terminal is coupled in said transmission line at a point which is no greater than one tenth wavelength from said other end.

6. The combination as set forth in claim 1 wherein said transmission line is a coaxial transmission line.

7. The combination as set forth in claim 1 wherein said transmission line is a microstrip transmission line.

8. The combination as set forth in claim 5 wherein said portion of said transmission line between said other end and said cathode terminal is an inductor.

9. The combination as set forth in claim 1 wherein said active device is a transferred electron logic device (TELD) having an anode terminal, a cathode terminal and a Schottky barrier gate terminal, said anode and cathode terminals connected in said transmission line, said gate electrode being adapted to receive an input signal thereat.

10. The combination as set forth in claim 9 further including power supplying means coupled between anode and said short circuited end for biasing said TELD to a point below its threshold voltage such that said TELD oscillates at a frequency $3 \cdot f$ in response to a signal at said gate terminal, said oscillations providing pulses that are transmitted through said transmission line and reflected to said TELD in a time $1 \div f$, where f is said fundamental frequency.

11. The combination as set forth in claim 10 wherein said output terminal is coupled to said cathode terminal and further including a filter coupled to said output terminal for passing signals of frequency f and $2 \cdot f$ and rejecting signals at other harmonic frequencies.

* * * * *

UNITED STATES PATENT AND TRADEMARK OFFICE
CERTIFICATE OF CORRECTION

PATENT NO. : 4,158,784
DATED : June 19, 1979
INVENTOR(S) : Walter R. Curtice

It is certified that error appears in the above-identified patent and that said Letters Patent is hereby corrected as shown below:

Column 3, line 1 "l" should be --$\ell$--;

Column 3, line 4 "l" should be --$\ell$--;

Column 3, line 51 "aquiescent" should be --a quiescent--;

Column 5, line 67 "l" should be --$\ell$--;

Column 6, line 1 "l" should be --$\ell$--

Signed and Sealed this

Ninth Day of October 1979

[SEAL]

Attest:

RUTH C. MASON
*Attesting Officer*

LUTRELLE F. PARKER
*Acting Commissioner of Patents and Trademarks*